United States Patent [19]
Pani et al.

[11] Patent Number: 5,640,344
[45] Date of Patent: Jun. 17, 1997

[54] PROGRAMMABLE NON-VOLATILE BIDIRECTIONAL SWITCH FOR PROGRAMMABLE LOGIC

[75] Inventors: Peter M. Pani, Mountain View; Benjamin S. Ting; Benny Ma, both of Saratoga, all of Calif.

[73] Assignee: BTR, Inc., Reno, Nev.

[21] Appl. No.: 506,828

[22] Filed: Jul. 25, 1995

[51] Int. Cl.⁶ .................................................. G11C 11/40
[52] U.S. Cl. ............... 365/182; 365/185.01; 365/185.05; 365/185.14; 365/185.26; 365/189.05
[58] Field of Search .................. 365/185.1, 189.08, 365/182, 185.01, 185.05, 185.14, 185.26, 189.05

[56] References Cited

U.S. PATENT DOCUMENTS

| | | |
|---|---|---|
| 4,573,144 | 2/1986 | Countryman, Jr. . |
| 4,879,688 | 11/1989 | Turner et al. ............... 365/201 |
| 4,896,296 | 1/1990 | Turner et al. ............... 365/189.08 |
| 5,247,478 | 9/1993 | Gupta et al. ............... 365/185 |
| 5,347,490 | 9/1994 | Terada et al. ............... 365/219 |
| 5,440,518 | 8/1995 | Hazani ............... 365/185.1 |
| 5,473,564 | 12/1995 | Kowalski ............... 365/185.1 |
| 5,574,466 | 11/1996 | Hagner et al. ............... 29/571 |

FOREIGN PATENT DOCUMENTS

| | | |
|---|---|---|
| 0085550 | 1/1983 | European Pat. Off. . |
| 0582319 | 6/1989 | European Pat. Off. . |
| 0 582 319 A2 | 6/1989 | European Pat. Off. ........ G11C 16/04 |

Primary Examiner—Viet Q. Nguyen
Attorney, Agent, or Firm—Blakely, Sokoloff, Taylor & Zafman

[57] ABSTRACT

A bidirectional passgate switch for connecting two conductors utilizes technology such as electrically erasable programmable read only memory (EEPROM). The switch includes two EEPROM components wherein the floating gates of the components are shared. In one embodiment a first n-channel passgate transistor is used for programming and storage of the state of the switch. The oxide of the first transistor is a thin oxide to enable ease of programming. A second n-channel passgate transistor functions as the bidirectional switch wherein the source and drain terminals are coupled to the routing lines to be selectively connected. The second transistor oxide is a thick oxide to minimize the leakage due to tunneling. Thus, the programming lines and routing lines are separated, making the programming process simpler while minimizing leakage.

13 Claims, 7 Drawing Sheets

$$X = \frac{C1}{C1 + C2} VCC + VC1$$

BEFORE ERASE/PROGRAMMING:
GATE VOLTAGE = VC1 = X = 0 V

ELECTRON FLOW FROM SOURCE TO CAPACITOR

|  | WORD LINE (WL) | BIT LINE (BL) |
|---|---|---|
| ERASE MODE ("0" STATE) ROW-WIDE ERASE | | |
| SELECTED LINE(S) | VPP | GROUND |
| UNSELECTED LINE(S) | GROUND | GROUND |
| PROGRAM MODE ("1" STATE) BIT-WIDE PROGRAM | | |
| SELECTED WORD LINE | GROUND | — |
| SELECTED BIT LINE | — | VPP |
| UNSELECTED WORD LINE(S) | VCC * | — |
| UNSELECTED BIT LINE(S) | — | GROUND |
| OPERATING | | |
| UNSELECTED LINES | VCC | ** |

\*: RAISE THE VOLTAGE LEVEL SUFFICIENTLY HIGH TO PREVENT ACCIDENTAL PROGRAMMING OF OTHER DEVICES IN THE ARRAY.

\*\*: DON'T CARE, CAN BE VCC OR FLOAT.

PROGRAMMABLE NON-VOLATILE BIDIRECTIONAL SWITCH FOR PROGRAMMABLE LOGIC

BACKGROUND OF THE INVENTION

1. Field of the Invention

This invention relates to switches for programming programmable logic devices. More particularly, the present invention relates to the use of non-volatile memory devices as memory and switching elements to provide programmable bidirectional connections.

2. Art Background

Programmable logic circuits such as field programmable gate arrays (FPGA) require a large number of program controlled switching elements to connect two or more wires together in order to form the proper logic functions specified in the design. For a one time programmable device such as anti-fuse FPGAs, the connection of two or more wires are accomplished by electrically annealing a junction point (anti-fuse) with high voltage and current such that the resistance were lowered from very high to very low thus allowing conduction of signals from one wire to the other through the anti-fuse. For re-programmable FPGAs, one typical way of connecting two wires is through the use of SRAM controlled passgate as a switch. The SRAM can be programmed through standard memory programming techniques in such a way that the output of the SRAM bit can turn "on" or "off" the associated passgate thus allowing the connection of two desired wires through the passgate. However, each time the component is powered down, the states of the bits would have to be reloaded from a source, such as a non-volatile EEPROM or the like, in order to reprogram the bits.

It is readily apparent that certain distinct advantages can be achieved using non-volatile memory elements to function as the switches to program the programmable logic device. However, such prior art elements are unidirectional and incur data retention problems. FIG. 1A illustrates a prior art example of a non-volatile memory switch showing a unidirectional signal path. The two n-channel non-volatile transistors shared common gates, including the floating charge capacitor of the element. The first transistor 10 is used as a memory storage element and the second transistor 15 is used an unidirectional passgate. When the switch is turned on, a signal originating at point 20 passes through inverter 22, the second transistor 15 to level regeneration circuitry 25 which restores the signal level which was degraded through the passgate. The regenerated signal is further boosted by a second driver-inverter 30.

FIG. 1B shows another prior art example of an array of elements wherein logic 0 and logic 1 of a unidirectional switch are separately controlled to effect a unidirectional signal path to selectively produce a product term of the inputs. FIG. 1C illustrates a prior art example of using non-volatile memory to form a programmable NOR function. A non-programmable n-input NOR gate can be formed by having n parallel stages of n-channel transistor 51 with different input terminals (IT) 50 as inputs and common product terminals (PT) 52 as output with Vds (53) grounded. For programmable case, FIG. 1C shows by using transistors 54, 55 and 56 and setting the states of the common gate line (CGL) 57, word select line (WSL) 58, and WDL 59, the node Vd 53 can be programmed to be either grounded or floating. If Vd 53 is floating, then IT 50 is disconnected to be a input for the NOR structure. When Vd 53 is at ground, then IT 50 is one of the NOR inputs. By constructing an n-parallel structures of the devices of FIG. 1C with common PTs (52) and individually controlled Vds (53) to be either at ground or float, a m-input NOR function can be programmed where m is less than or equal to n. The input signals go to ITs (50) and the NOR function operates on those transistors 51 where the associated Vds (53) are grounded. The resulting output of the m-input NOR is the common product term 52.

As can be seen from the above examples, the prior art devices described are used to form programmable n-input, one output logic functions having unidirectional signal flow. In addition, other problems exist with the prior art devices. These problems will be explained with reference to FIGS. 2–5.

FIG. 2 shows a commonly known-channel non-volatile transistor in symbolic form. FIG. 3 illustrates the same n-channel non-volatile transistor in a simplified capacitor model form showing a floating charge capacitor and substrate capacitor model. It is commonly known that the voltage at node 305 (represented as X) is the fraction of the capacitance of the floating charge capacitor 310 divided by the sum of the capacitance of the floating charge capacitor 310 and the capacitance of the substrate capacitor 315 (coupling ratio) multiplied by the gate voltage. Initially, before any programming, all voltages are zero.

During erase mode, as shown in FIG. 4A, the gate is set at V++ programming voltage (Vpp) to allow electrons to flow from the source terminal to the floating gate capacitor resulting in a negative voltage on the floating gate capacitor C1. After the erase operation is complete, the source and the gate terminals are grounded, as shown in FIG. 4B, and the charged floating gate capacitor C1 is at −5 Volts. In actual circuit operation, the gate is set at Vcc which is at 5 V (or 3.3 V for low voltage operation). In the 5 V case, as shown in FIG. 4C, the node voltage 405 is at −2 Volts indicating that the transistor is at the "off" state, that is, the transistor is non-conducting.

During the programming mode, as shown in FIG. 5A, the gate terminal is coupled to ground and the source terminal is coupled to V++, the programming voltage (Vpp). In this mode, the electron charge flows from Capacitor C1 to the source terminal, resulting in a positive voltage at the floating gate capacitor. FIG. 5B shows the voltage at C1 to be 3 volts. In the normal circuit operation mode, wherein all memory cells are programmed, the gate voltage is set to Vcc, the normal power supply. In the case the voltage at C1 is at 3 volts, the voltage at node 505 is at 6 volts, which is higher than Vcc, indicating that the transistor is conducting. Since the state has a voltage higher than Vcc, the need to have the voltage level regeneration circuitry shown in FIG. 1A is eliminated. An additional feature is that the conducting resistance of the on-stage is lower as the result of the higher gate voltage thus improving the speed of the gate.

A single transistor structure as described above can be used both as non-volatile memory storage element and a switch connecting or disconnecting two lines, saving significant space on the component die. However, there are problems when using a single transistor for dual functions due to the mixing of programming lines and routing lines at the source and drain nodes of the transistor. Furthermore, when a single transistor structure is used, data retention is a problem.

Read disturbance problems arise when the passgate is conducting to couple two connectors resulting in data retention problems. A non-volatile device with stored charge on a floating gate suffers from potential charge loss over a long period of time due to undesired tunneling (charge injection) through the tunnel dielectric which consists of a thin oxide (typically less than 100 Angstroms). Such undesired tunneling is one of the primary causes of data loss. The oxide is thin to enable programming of the device. When the device is used as memory only, the data loss potential is not a problem as the duration of data read operations are brief. Typically, most manufacturers specify a minimum data retention period of ten years for devices that experience normal usage.

The undesired tunneling, however, can happen during the read operation of the memory cell when the device is in the conducting mode. A field is introduced across the dielectric due to the voltage difference between the source and the gate. For the memory cell this read period is very short hence the disturbance is minimal. For applications where the device is used for connecting two wires conducting signals from/to source to/from drain of the device, the disturbance, and therefore the tunneling across the dielectric, can be significant causing failure in the device over a short period of time.

SUMMARY OF THE INVENTION

The present invention provides a non-volatile switch comprising a non-volatile floating gate device (such as EEPROM or Flash) as a programmable switch controlled through non-volatile memory device to connect two or more wires for the use in a programmable logic device. The non-volatile switch replaces prior use of a SRAM bit and associated passgate thus reducing silicon area hence cost.

In one embodiment, the bidirectional passgate switch utilizes technology such as electrically erasable programmable read only memory (EEPROM) or Flash memory. The switch includes two EEPROM or Flash memory components wherein the floating gates of the components are shared. The first n-channel passgate transistor is used for programming and storage of the state of the switch. The oxide of the first transistor is a thin oxide to enable ease of programming. The second n-channel passgate transistor functions as the bidirectional switch wherein the source and drain terminals are coupled to the routing lines to be selectively connected. The second transistor oxide is a thick oxide to minimize the leakage due to tunneling. Thus, the programming lines and routing lines are separated, making the programming process simpler while minimizing leakage.

BRIEF DESCRIPTION OF THE DRAWINGS

FIG. 8 is a table depicting illustrative voltages applied to the bit lines and word lines of an array of switches to program the identified switch on and off.

DETAILED DESCRIPTION OF THE PREFERRED EMBODIMENT

In the following description, for purposes of explanation, numerous details are set forth, in order to provide a thorough understanding of the present invention. However, it will be apparent to one skilled in the art that these specific details are not required in order to practice the present invention. In other instances, well known electrical structures and circuits are shown in block diagram form in order not to obscure the present invention unnecessarily.

As will become apparent below, the non-volatile switch of the present invention provides a number of distinct advantages including a 40% or more improvement in switch density over prior art SRAMs given same process technology feature size and the elimination of a companion EPROM or EEPROM device for configuration loading. The non-volatile switch of the present invention also provides advantages over prior art non-volatile memory devices including improved data retention and bidirectional connections with no need of voltage regeneration circuitry. The non-volatile, bidirectional switch of the present invention is described utilizing n-channel transistors; however, it is contemplated that other configurations of non-volatile transistors can be used.

Figure 1A:
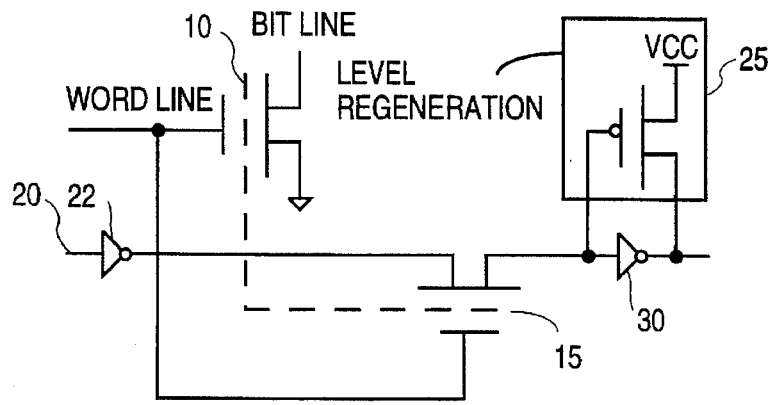
FIG. 1A illustrates a prior art example of a non-volatile memory switch showing a unidirectional signal path.
Figure 1B:
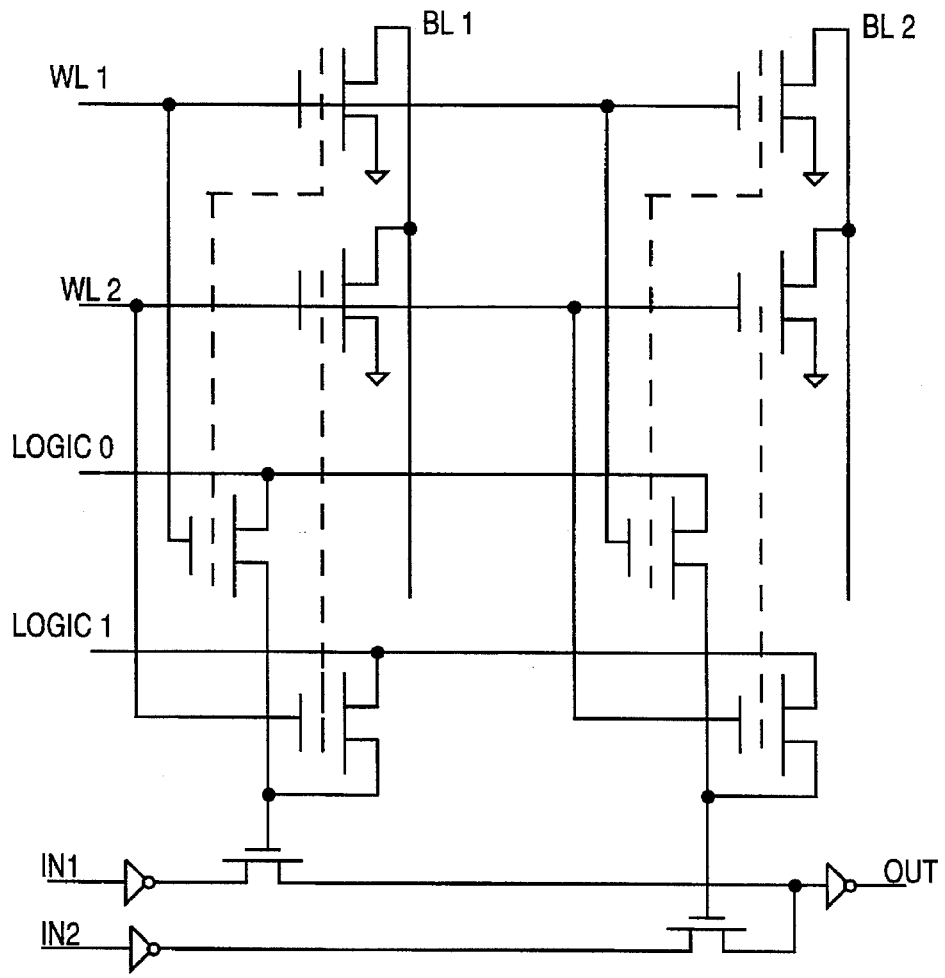
FIG. 1B shows another prior art example where logic 0 and logic 1 are separately controlled to effect a unidirectional signal path.
Figure 1C:
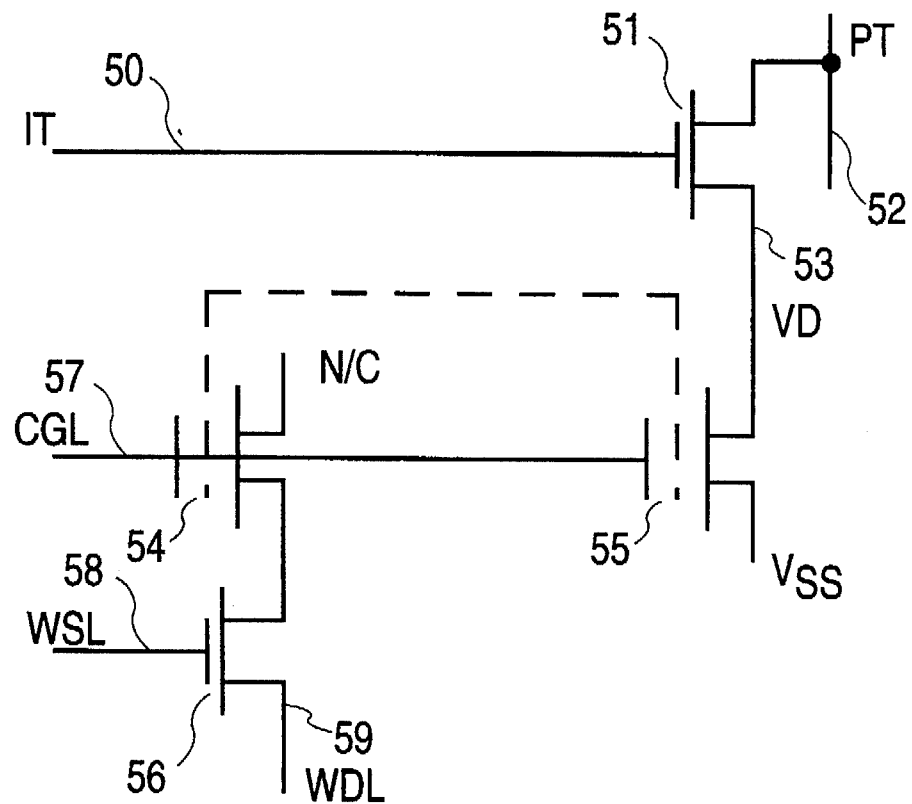
FIG. 1C shows a prior art example showing a four transistors structure.
Figure 2:
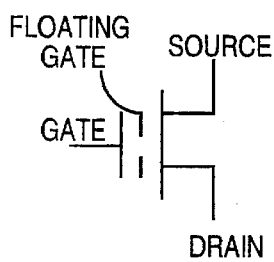
FIG. 2 shows a commonly known n-channel non-volatile transistor in symbolic form
Figure 3:
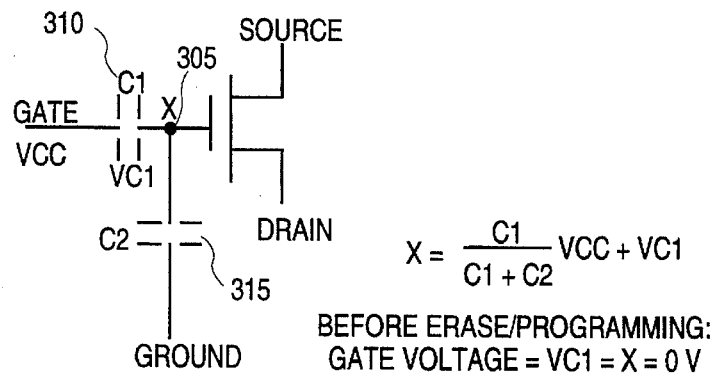
FIG. 3 shows the n-channel non-volatile transistor of FIG. 2 using a floating charge capacitor and substrate capacitor model representation.
Figure 4A:
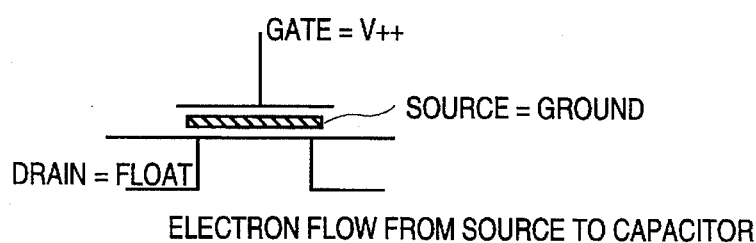
FIG. 4A illustrates a device during erase mode.
Figure 4B:
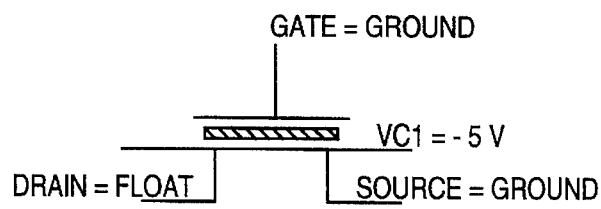
FIG. 4B illustrates a device after erase.
Figure 4C:
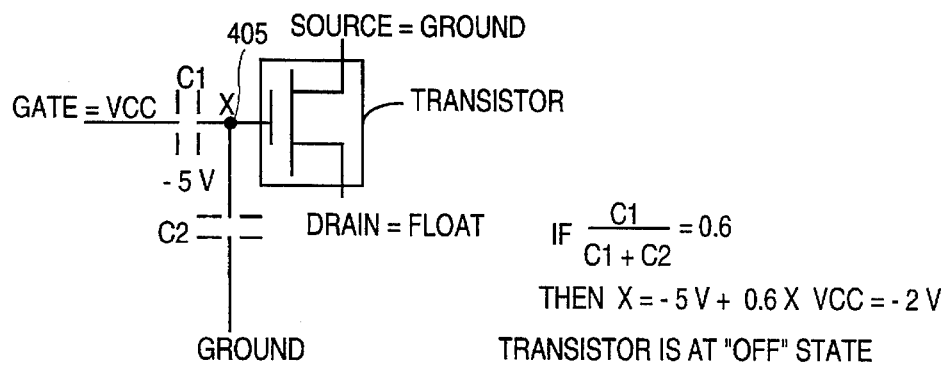
FIG. 4C shows a device following the capacitor model when the device in the "off" state.
Figure 5A:
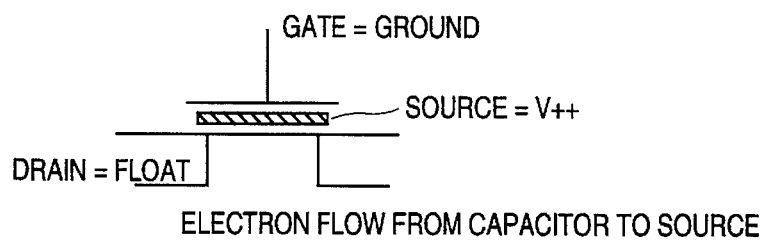
FIG. 5A illustrates a device during programming mode.
Figure 5B:
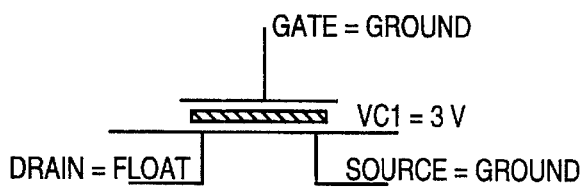
FIG. 5B illustrates the device after programming.
Figure 5C:
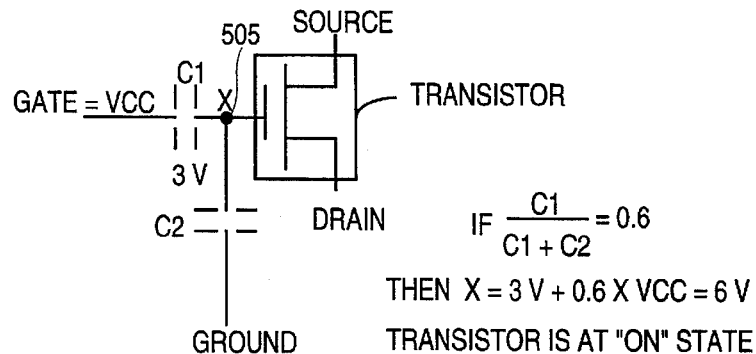
FIG. 5C illustrates a device following the capacitor model when the device is in the "on" state.
Figure 6A:
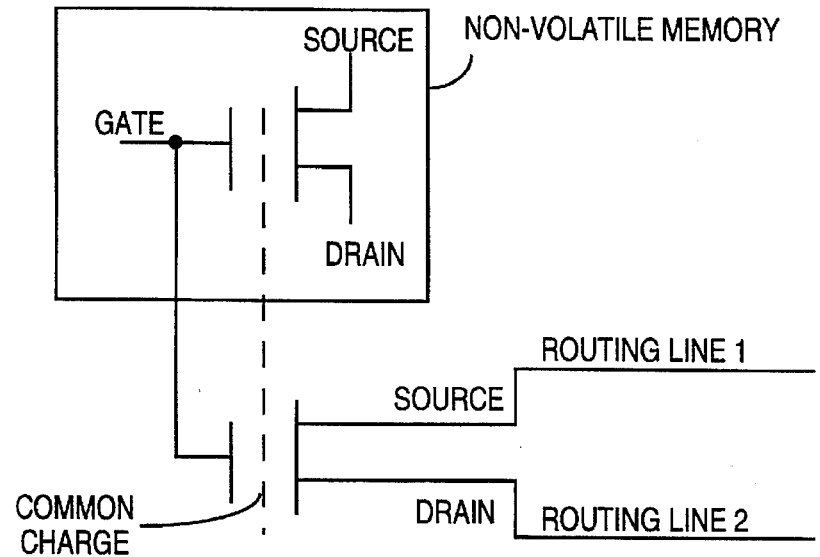
FIGS. 6A and 6B illustrate embodiments of the non-volatile, bidirectional switch of the present invention.
Figure 6B:
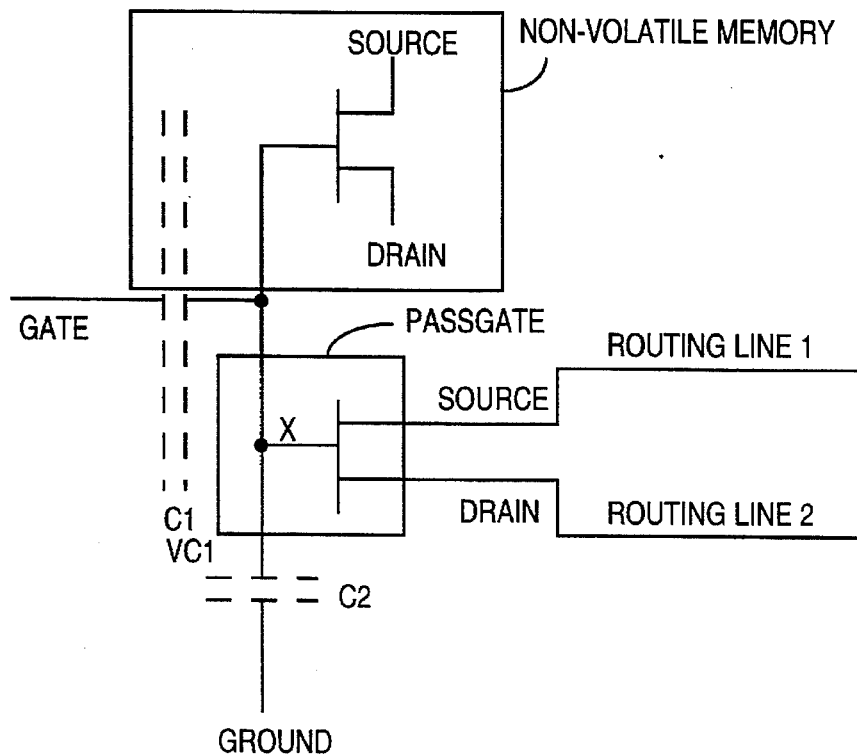

FIGS. 6A and 6B illustrate one embodiment of non-volatile bidirectional passgate switch using technology such as electrically erasable programmable read only memory (EEPROM), including Flash memory.

The switch includes two transistors wherein the floating gates of the two transistors are shared. The first n-channel passgate transistor is used for programming the switch and is typically has a thin oxide of 50–110 Angstroms. The thin oxide enables sufficient charge for long term data retention to be place on the floating gate. Furthermore, the thin oxide enables programming at typical or lower EEPROM programming voltages. The second n-channel passgate transistor functions as a bidirectional switch for connecting two conductors such as routing lines in a matrix. To minimize leakage and improve data retention the second transistor is typically constructed of a thick oxide (approximately 100–500 Angstroms).

The bidirectional nonvolatile switch results in a configuration in which the programming lines and routing lines are separated. The programming lines are used to perform a straightforward programming process of a portion of the device that appears as a traditional nonvolatile transistor, such as memory bit. A second portion of the device includes a thick oxide charge gate device that functions as a bidirectional passgate switch connecting at least two signal lines and controlled by the memory bit. The resulting memory-passgate device is significantly smaller than the comparable SRAM-passgate device. In additional to die size reduction, this embodiment also eliminates the need to have a companion EPROM/EEPROM memory device to load the program configuration thus resulting in further savings in both board space and components costs.

Referring to the embodiment set forth in FIG. 6B, the programming window is set at [−5 V, 3 V] wherein capacitor voltage at C1 is charged to −5 Volts at Erase Mode and capacitor voltage at C1 is charged to 3 Volts at Programming Mode. Since voltage at X is at 6 volts when the n-channel passgate is "on", the passgate is essentially "charged" above the power supply voltage of 5 Volts, thus reducing the on-stage resistance and improving the switching speed. As separate transistors with shared charge and gates are utilized, data retention on the thin oxide gate is not a problem because the "read" occurs at the thick oxide gate. There is much less leakage problem at the thick gate due to oxide thickness thus improving both the reliability and the life cycle of the programmable switch.

As noted above, the above described bidirectional switch can be utilized in a programmable logic device such as a field programmable gate array (FPGA). The bidirectional switches are used to selectively connect routing lines in the FPGA structure to interconnect various logic and combinatorial elements resulting in a device that performs the programmed function. An illustrative architecture is illustrated in PCT Application No. PCT/US94/07187 published Feb. 9, 1995.

Figure 7:
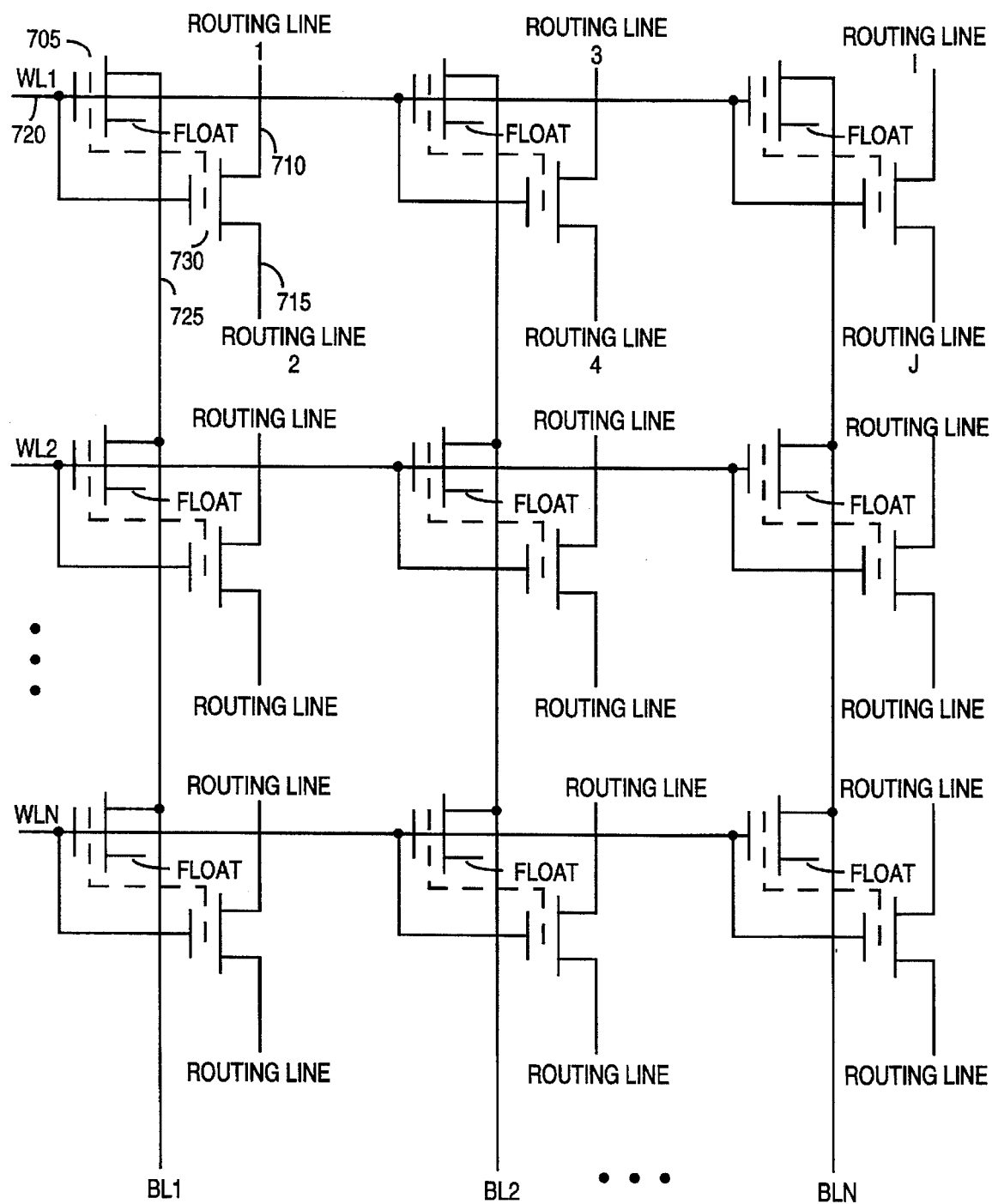
FIG. 7 illustrates a non-volatile bidirectional switch array in accordance with the teachings of the present invention.

FIG. 7 illustrates an array of the non-volatile bidirectional switches described above to replace prior SRAM/passgate structures used in the prior art. Each switch is coupled to two routing lines, for example switch 730 is coupled to routing lines 710 and 715. To program the switch to connect routing lines 710 and 715, the corresponding word line 720 is grounded and the corresponding bit line 725 is set to the programming voltage Vpp (e.g. 12 volts). The remaining word lines are set to a voltage level sufficiently high to prevent accidental programming of other devices, for example, Vcc (5 volts). The remaining bit lines are grounded. Once programmed, all the word lines are set to Vcc (e.g. 5 volts or 3.3 volts for the low voltage device case) and all the bit lines are in a "don't care" state, which, depending on the actual process characteristics, can be Vcc or float. The transistor 705 which is the memory bit is hence programmed to the "on" state ("1") causing the programmable switch 730 (which has a thick gate oxide) to be in the conducting mode and therefore functions as a connection between routing lines 710 and 715 without experiencing data retention problems due to leakage.

Initially all the bits in the array are programmed to an "off" state by an erase operation which is performed by setting a selected word line to the programming Vpp, all the bit lines to ground and the remaining unselected word lines to ground. This step is repeated for each word line until all the bits are "erased". Once the array is initialized to an off state, selective switches are programmed to provide the desired interconnection through the on-state programming procedure described earlier.

FIG. 8 shows the programming sequence of the non-volatile switch array. The values set forth in FIG. 8 are preferably utilized by first zeroing out all the bits to be "off" by a "bulk erase" step that can be likened to a written "0" state and the selective programming of switches to the "on" state which is similar to writing "1" to the desired memory bits. Once all the programmable switches are set at the desired "on" or "off" states by programming the associated memory bits, the programming lines (word lines and bit lines) are unselected. The word lines are set to Vcc and bit lines are set to a "don't care" state, which depending on the characteristics of the process technology, can be Vcc or float.

The invention has been described in conjunction with the preferred embodiment. It is evident that numerous alternatives, modifications, variations and uses will be apparent to those skilled in the art in light of the foregoing description.

What is claimed is:

1. A non-volatile bidirectional switch comprising:

a first non-volatile transistor element comprising a first portion of a floating gate surrounded in part by a first oxide, and a first terminal, a second terminal, and a third terminal, said first oxide of a thickness thin enough to enable the placement of sufficient charge on said floating gate for long term data retention by applying programming voltages to the first terminal and second terminal; and a second non-volatile transistor element comprising a second portion of the floating gate surrounded in part by a second oxide, and a fourth terminal, a fifth terminal, and a sixth terminal, said fifth terminal and sixth terminals respectively coupled to a first conductor and second conductor, said second oxide of a thickness thick enough to prevent unwanted leakage current when said floating gate is programmed to an "on" state connecting the first conductor and second conductor.

2. The non-volatile bidirectional switch as set forth in claim 1, wherein the first oxide has a thickness in the range of 50–110 Angstroms.

3. The non-volatile bidirectional switch as set forth in claim 1, wherein the second oxide has a thickness in the range of 100–500 Angstroms.

4. The non-volatile bidirectional switch as set forth in claim 1, wherein the first and fourth terminals are coupled together.

5. The non-volatile bidirectional switch as set forth in claim 5, wherein the floating gate is erased by applying a programming voltage (Vpp) to the first terminal and grounding the second terminal.

6. The non-volatile bidirectional switch as set forth in claim 5, wherein the floating gate is programmed by grounding the first terminal and setting the second terminal to the programming voltage.

7. An array of non-volatile bidirectional switches arranged in rows and columns, each switch programmably coupling a pair of routing lines;

each switch comprising:

a first non-volatile transistor element comprising a first portion of a floating gate surrounded in part by a first oxide, and a first terminal, a second terminal, and a third terminal, said first oxide of a thickness thin enough to enable the placement of sufficient charge on said floating gate for long term data retention by applying programming voltages to the first terminal and second terminal; and a second non-volatile transistor element comprising a second portion of said floating gate surrounded in part by a second oxide, and a fourth terminal, a fifth terminal, and a sixth terminal, said fifth terminal and sixth terminal respectively coupled to a first conductor and second conductor, said second oxide of a thickness thick enough to prevent unwanted leakage current when said floating gate is programmed to an "on" state connecting a first conductor and second conductor of the pair of conductors;

a first set of control lines, each control line coupled to each first terminal and fourth terminal of each switch in a row; and a second set of control lines, each control line coupled to each second terminal of each switch in a column.

8. The array as set forth in claim 7, wherein the first oxide has a thickness in the range of 50–110 Angstroms.

9. The array as set forth in claim 7, wherein the second oxide has a thickness in the range of 100–500 Angstroms.

10. The array as set forth in claim 7, wherein the first and fourth terminals are coupled together.

11. The array as set forth in claim 7, wherein the floating gate of each switch of a selected row is erased by applying a programming voltage (Vpp) to a first selected control line of the first set of control lines coupled to the selected row and coupling the second set of control lines to ground and the first control lines, excluding the selected control line of the first set of control lines, to ground.

12. The array as set forth in claim 7, wherein the floating gate of a selected switch is programmed by coupling a selected first control line of the first set of control lines coupled to a first and fourth terminal of the selected switch to ground, coupling a selected second control line of the second set of control lines coupled to a second terminal of the selected switch to the programming voltage, coupling control lines of the first set of control lines, exclusive of the selected first control line, to a voltage level sufficiently high to prevent accidental programming of unselected switches, and coupling control lines of the second set of control lines, exclusive of the selected second control line, to ground.

13. A method for operating a non-volatile bidirectional switch comprising the steps of:

providing a first non-volatile transistor element having a first portion of a floating gate surrounded in part by a first oxide, and a first terminal, a second terminal, and a third terminal, said first oxide of a thickness thin enough to enable the placement of sufficient charge on said floating gate for long term data retention by applying programming voltages to the first terminal and second terminal and a second non-volatile transistor element comprising a second portion of the floating gate surrounded in part by a second oxide, and a fourth terminal, a fifth terminal, and a sixth terminal, said fifth terminal and sixth terminal respectively coupled to a first conductor and second conductor, said second oxide of a thickness thick enough to prevent unwanted leakage current when said floating gate is programmed to an "on" state connecting the first conductor and second conductor coupling the first and fourth terminals together;

if said floating gate is to be erased, applying a programming voltage (Vpp) to the first terminal and grounding the second terminal; and if said floating gate is to be programmed, grounding the first terminal and setting the second terminal to the programming voltage.

\* \* \* \* \*